(12) United States Patent
Yamazaki et al.

(10) Patent No.: US 6,900,550 B2
(45) Date of Patent: May 31, 2005

(54) SEMICONDUCTOR DEVICE INCLUDING ADHESIVE AGENT LAYER WITH EMBEDDED CONDUCTOR BODIES

(75) Inventors: Osamu Yamazaki, Saitama (JP); Kazuyoshi Ebe, Shiraoka-machi (JP)

(73) Assignee: LINTEC Corporation, Tokyo (JP)

( * ) Notice: Subject to any disclaimer, the term of this patent is extended or adjusted under 35 U.S.C. 154(b) by 0 days.

(21) Appl. No.: 10/463,409

(22) Filed: Jun. 18, 2003

(65) Prior Publication Data

US 2004/0012098 A1 Jan. 22, 2004

Related U.S. Application Data

(62) Division of application No. 10/107,176, filed on Mar. 28, 2002.

(30) Foreign Application Priority Data

Mar. 30, 2001 (JP) .......................................... 2001-99019

(51) Int. Cl.[7] .......................... H01L 23/48; H01L 23/52; H01L 29/40
(52) U.S. Cl. ..................................................... 257/783
(58) Field of Search ................................ 257/777, 778, 257/787, 737, 701, 702, 783, 687; 156/247, 249, 344, 230, 235, 47, 48, 51, 52, 55

(56) References Cited

U.S. PATENT DOCUMENTS

| | | | | |
|---|---|---|---|---|
| 5,110,388 A | * | 5/1992 | Komiyama et al. | 156/229 |
| 5,637,176 A | * | 6/1997 | Gilleo et al. | 156/277 |
| 5,918,113 A | * | 6/1999 | Higashi et al. | 438/119 |
| 6,673,441 B1 | * | 1/2004 | Tanaka et al. | 428/355 EP |

* cited by examiner

Primary Examiner—David Zarneke
(74) Attorney, Agent, or Firm—Posz Law Group, PLC

(57) ABSTRACT

A semiconductor integrated circuit is adhered to the substrate and includes semiconductor integrated circuit electrodes. A hardened adhesive agent layer is formed from an adhesive agent with gradable adhesiveness and has conductor bodies buried therein. The adhesive agent includes a (meth)acrylate copolymer having a weight-average molecular weight of not less than 30,000, an epoxy resin having a weight-average molecular weight of 100 to 10,000, a photopolymerizable low molecular compound and thermal activation latent epoxy resin curing agent. The conductor bodies are connected with the semiconductor integrated circuit electrodes, and the adhesive agent layer is aligned with the substrate so that the conductor bodies buried in the adhesive agent layer and the substrate electrodes are electrically connected.

4 Claims, 4 Drawing Sheets

SEMICONDUCTOR DEVICE INCLUDING ADHESIVE AGENT LAYER WITH EMBEDDED CONDUCTOR BODIES

CROSS-REFERENCE TO RELATED APPLICATIONS

The present application is a Rule 53(b) divisional application of U.S. application Ser. No. 10/107,176, filed Mar. 28, 2002, which in turn is related to and claims priority from Japanese application serial no. 2001-099019, filed Mar. 30, 2001.

BACKGROUND OF THE INVENTION

1. Field of the Invention

The present invention relates to a semiconductor device bonded by a so-called flip-chip mounting method, a process for producing the same, and an adhesive sheet to be used for adhering a semiconductor chip or a semiconductor wafer and a substrate to produce the same.

2. Description of the Related Art

In recent years, in terms of a semiconductor integrated circuit (IC) getting more integrated and semiconductor device (IC package) getting more compact, etc., a flip-chip mounting method has come to be applied. The flip-chip mounting method is a kind of a wireless bonding method including the steps of forming bumps made by soldering, etc. on electrodes on a surface of the semiconductor chip, mounting the semiconductor chip made to be upside down on a print substrate, ceramic substrate or other substrates, aligning the bumps with the electrodes on the substrate, then, heating to fuse the bumps so that the electrodes of the semiconductor chip and the electrodes of the substrate are bonded.

In a semiconductor device made by the above flip-chip mounting method, a resin called an under filling material is generally provided between the semiconductor chip and the substrate to prevent crack, etc. caused by a difference of coefficients of linear expansion between the semiconductor chip, the bumps and the substrate.

As the under filling material, a liquid epoxy resin composition obtained by blending an epoxy resin, curing agent and inorganic filler is normally used. The liquid epoxy resin composition is hardened after being injected into a space between the semiconductor chip and the substrate.

Recently, rapid progress has been made along with higher integration of a semiconductor integrated circuit, such as multi-electrodes, narrower pitches between electrodes, and the semiconductor device getting thinner, so spaces between the bumps are becoming extremely narrow and a distance between the semiconductor chip and the substrate is becoming extremely short. When the spaces between bumps become extremely narrow and the distance between the semiconductor chip and the substrate becomes extremely short as above, it becomes hard for the under filling material to get into the space between the semiconductor chip and the substrate (between the bumps) due to a flow resistance. Then, the under filling material hardens in a state it is not sufficiently spread out in the space between the semiconductor chip and the substrate, and when there arises a deficiency in the under filling material, the quality of a resulting semiconductor device decreases.

SUMMARY OF THE INVENTION

The present invention was made in consideration with the above circumstances and has as an object thereof to provide a semiconductor device free from defects caused by fluidity of an under filling material, a process for producing the same, and an adhesive sheet to be used for producing the semiconductor device.

To attain the above object, according to the present invention, there is provided an adhesive sheet comprising a base material, an adhesive agent layer formed on the base material and conductor bodies buried in the adhesive agent layer in an arrangement corresponding to electrodes of a semiconductor integrated circuit and electrodes of a substrate, wherein an adhesive agent constituting the adhesive agent layer has gradable adhesiveness.

The adhesive agent layer preferably has a function as a so-called under filling material, that is, it is preferable to have a coefficient of linear expansion close to those of the semiconductor wafer or semiconductor chip, substrate and conductor bodies when finally hardens.

The adhesive agent which has gradable adhesiveness may have a stage of exhibiting tackiness (removable adhesiveness) and a stage of exhibiting adhesiveness (a so-called tacky adhesive agent), or may be those which do not exhibit any tackiness/adhesiveness in a normal state but exhibit gradable tackiness/adhesiveness by a heat, compression or other triggers. Due to the gradable adhesiveness of an adhesive agent of the adhesive agent layer, sticking to a semiconductor wafer/chip or a substrate, remove of a base material, temporary adhesion and actual adhesion of the semiconductor wafer/chip and the substrate can be efficiently performed when producing a semiconductor device.

When the adhesive agent layer is insulative, it is preferable that upper ends and/or lower ends of the conductor bodies are substantially positioned on the front surface and/or the back surface of the adhesive agent layer. It is for securely connecting the electrode of the semiconductor integrated circuit and the electrode of the substrate via the conductor bodies. However, it is not limited to the above when the adhesive agent layer has anisotropic conductivity. Note that even when the above adhesive agent layer is insulative and the conductor bodies are completely buried in the adhesive agent layer, it is possible to connect an electrode of the semiconductor integrated circuit and an electrode of the substrate via the conductor bodies by a pressing in the thickness direction, etc.

The above conductor bodies attached adhesive sheet may be made to be a size corresponding to a semiconductor wafer, and the conductor bodies may be arranged so as to correspond to electrodes of a plurality of semiconductor integrated circuits formed on the semiconductor wafer. According to the adhesive sheet, a semiconductor device can be produced in a wafer size, thus, production of a semiconductor device at high speed and at low cost can be attained.

A first process for producing a semiconductor device according to the present invention comprises the steps of; sticking a semiconductor chip or a semiconductor wafer and the conductor bodies attached adhesive sheet so that electrodes of a semiconductor integrated circuit formed on the semiconductor chip or semiconductor wafer and the conductor bodies of the adhesive sheet can be electrically connected (It does not always have to be connected in this step. It will be same below); removing the base material from the adhesive agent layer of the conductor bodies attached adhesive sheet (It naturally includes the meaning of removing the adhesive agent layer from the base material. It will be same below); and aligning the adhesive agent layer with a substrate so that the conductor bodies buried in the adhesive agent layer and electrodes of the substrate can be electrically connected, and adhering the semiconductor chip or semiconductor wafer and the substrate.

A second process for producing a semiconductor device according to the present invention comprises the steps of; sticking a substrate and the conductor bodies attached adhesive sheet so that electrodes of the substrate and the conductor bodies of the adhesive sheet can be electrically connected; removing the base material from the adhesive agent layer of the conductor bodies attached adhesive sheet; and aligning a semiconductor chip or a semiconductor wafer with the adhesive agent layer so that electrodes of a semiconductor integrated circuit formed on the semiconductor chip or semiconductor wafer and the conductor bodies buried in the adhesive agent layer can be electrically connected, and adhering the substrate and the semiconductor chip or semiconductor wafer.

A third process for producing a semiconductor device according to the present invention comprises the steps of; sticking a semiconductor wafer and the conductor bodies attached adhesive sheet so that electrodes of a semiconductor integrated circuit formed on the semiconductor wafer and the conductor bodies of the adhesive sheet can be electrically connected; removing the base material from the adhesive agent layer of the conductor bodies attached adhesive sheet; aligning the adhesive agent layer with a substrate so that the conductor bodies buried in the adhesive agent layer and electrodes of the substrate can be electrically connected, and adhering the semiconductor wafer and the substrate; and cutting a laminate obtained by adhering the semiconductor wafer and the substrate to obtain a semiconductor device.

A fourth process for producing a semiconductor device comprises the steps of; sticking a substrate and the conductor bodies attached adhesive sheet so that electrodes of the substrate and the conductor bodies of the adhesive sheet can be electrically connected; removing the base material from the adhesive agent layer of the conductor bodies attached adhesive sheet; aligning a semiconductor wafer with the adhesive agent layer so that electrodes of semiconductor integrated circuit formed on the semiconductor wafer and the conductor bodies buried in the adhesive agent layer can be electrically connected, and adhering the substrate and the semiconductor wafer; and cutting a laminate obtained by adhering the substrate and the semiconductor wafer to obtain a semiconductor device.

A fifth process for producing a semiconductor device comprises the steps of; sticking a semiconductor wafer and the conductor bodies attached adhesive sheet so that electrodes of a semiconductor integrated circuit formed on the semiconductor wafer and the conductor bodies of the adhesive sheet can be electrically connected; cutting the semiconductor water together with the adhesive agent layer of the conductor bodies attached adhesive sheet to obtain semiconductor chips; expanding spaces between the semiconductor chips if needed; removing the adhesive agent layer attached semiconductor chip from the base material of the conductor bodies attached adhesive sheet; and aligning the adhesive agent layer with a substrate so that the conductor bodies buried in the adhesive agent layer and electrodes of the substrate can be electrically connected, and adhering the semiconductor chip and the substrate. The process of widening the space between the semiconductor chips may be performed also by expanding the base material or by expanding other sheet (wafer dicing sheet) adhered on the base material.

The process for producing a semiconductor device may further comprise a step of relatively improving an adhesion force of the adhesive agent layer to the semiconductor chip, semiconductor wafer or substrate than an adhesion force of the adhesive agent layer to the base material before the step of removing the base material from the adhesive agent layer of the conductor bodies attached adhesive sheet. By performing the step, the base material can be removed from the adhesive agent layer while making the adhesive agent layer remained on the semiconductor chip, semiconductor wafer or the substrate.

A first semiconductor device according to the present invention is produced by the above process. Note that as far as the obtained semiconductor device is identical or substantially identical or equivalent to those produced by the above process for producing a semiconductor device, semiconductor devices produced by a different process are also included in the scope of the present invention.

A second semiconductor device according to the present invention comprises a semiconductor chip, a substrate adhered to the semiconductor chip via an adhesive agent layer, and conductor bodies for electrically connecting electrodes of a semiconductor integrated circuit formed on the semiconductor chip and electrodes of the substrate in the adhesive agent layer, wherein the adhesive agent layer is obtained by hardening a layer of an adhesive agent wherein the conductor bodies are buried.

In the present invention, since a conductor bodies is buried in advance in an adhesive agent layer, the adhesive agent layer functions as an under filling material, so a process of injecting an under filling material to a space between a semiconductor chip and a substrate becomes unnecessary. Accordingly, defects caused by fluidity of the under filling material can be prevented in the obtained semiconductor device.

BRIEF DESCRIPTION OF THE DRAWINGS

These and other objects and features of the present invention will become clearer from the following description of the preferred embodiments given with reference to the attached drawings, in which.

DESCRIPTION OF THE PREFERRED EMBODIMENTS

Below, embodiments of the present invention will be explained.

First Embodiment

Figure 1:
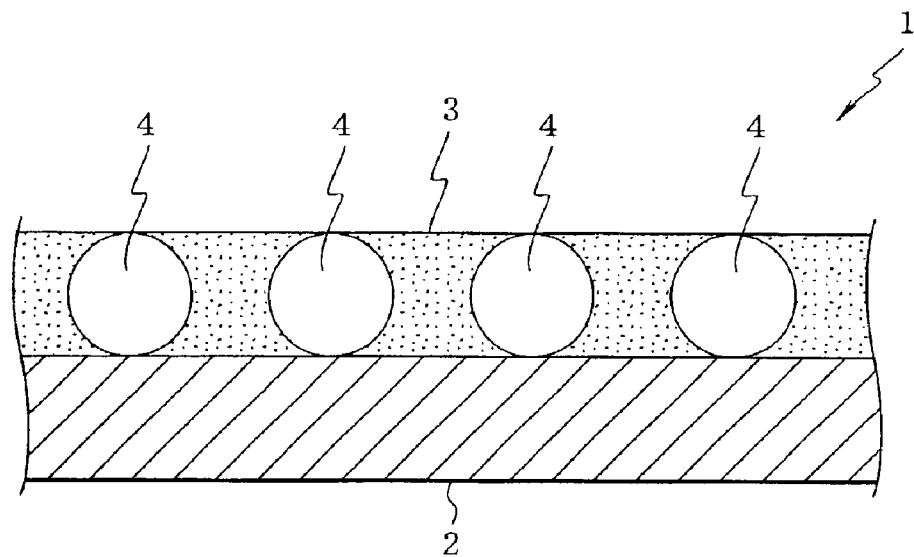
FIG. 1 is a schematic cross-sectional view of a conductor bodies attached adhesive sheet according to an embodiment of the present invention.
Figure 2:
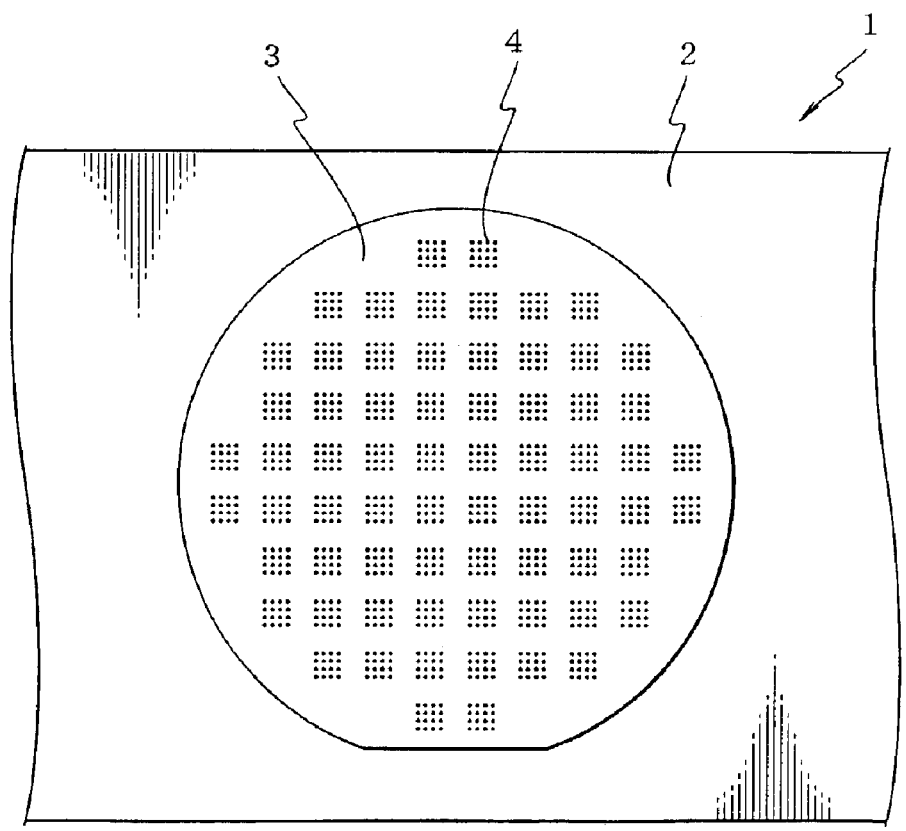
FIG. 2 is a schematic plane view of a conductor bodies attached adhesive sheet according to the same embodiment.
Figure 3:
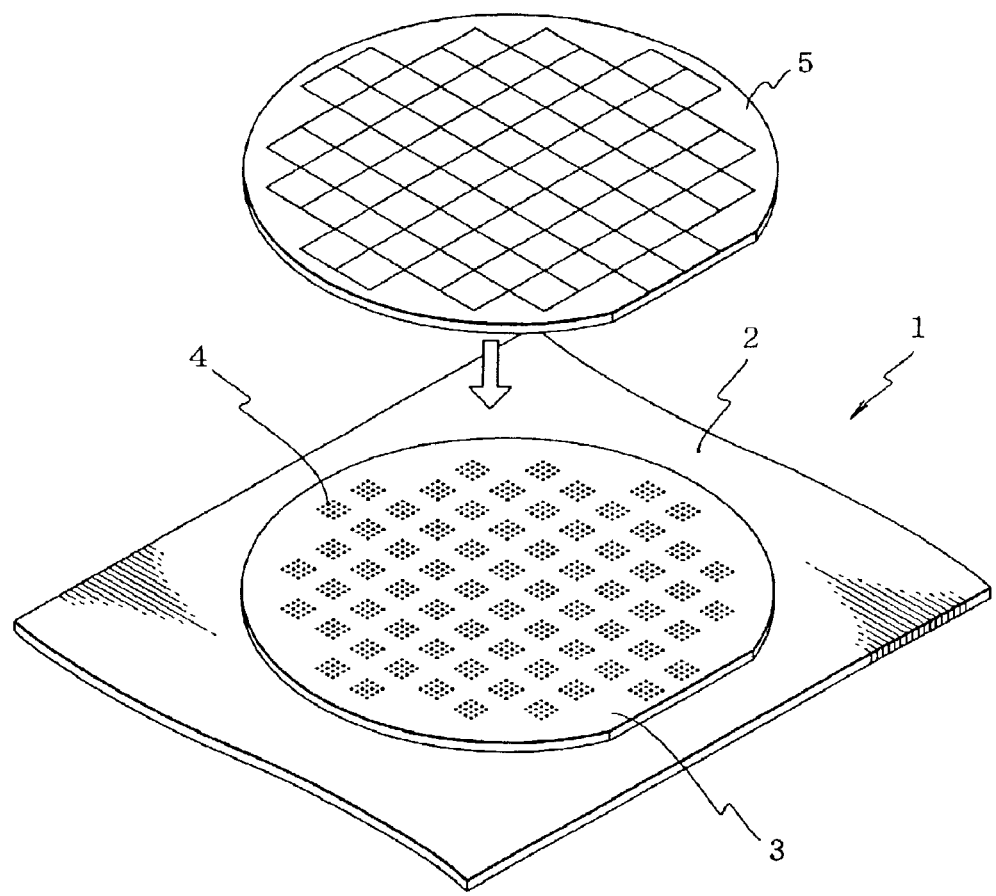
FIG. 3 is a schematic perspective view of when sticking the conductor bodies attached adhesive sheet according to the same embodiment and a semiconductor wafer.
Figure 4:
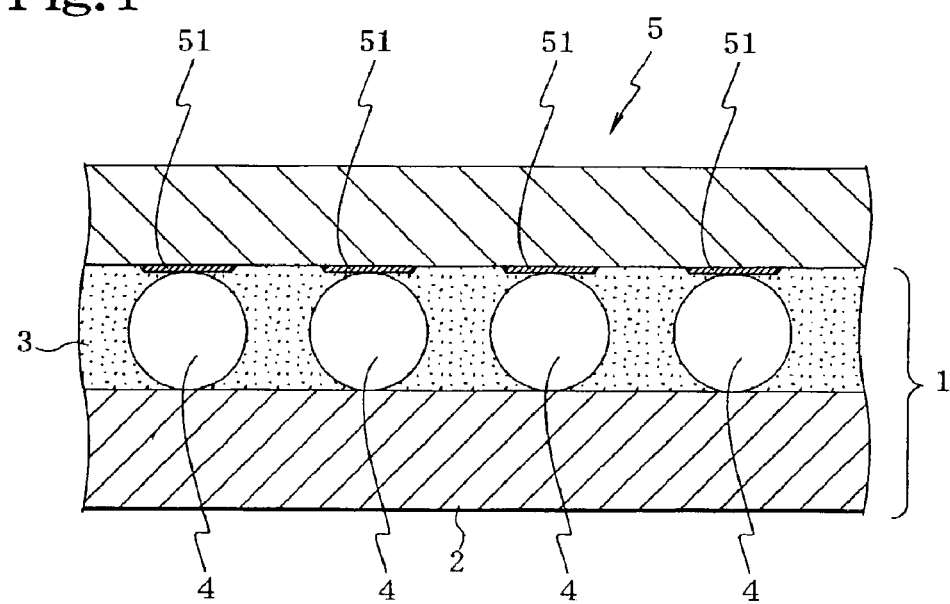
FIG. 4 is a schematic cross-sectional view of a state where the conductor bodies attached adhesive sheet according to the same embodiment and a semiconductor wafer are stuck.
Figure 5:
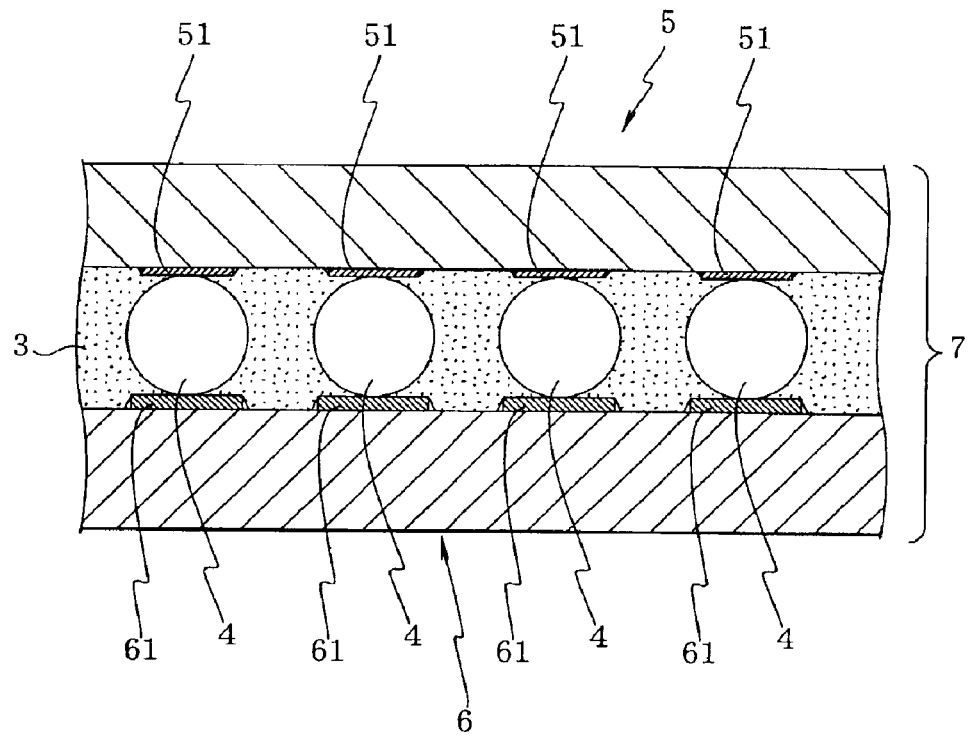
FIG. 5 is a schematic cross-sectional view of a state where an adhesive agent layer of the conductor bodies attached adhesive sheet according to the same embodiment and a substrate are aligned (furthermore, a state where the semiconductor wafer and the substrate are adhered via the adhesive agent layer)

FIG. 1 is a schematic cross-sectional view of an adhesive sheet including conductor bodies (referred to throughout this specification also as a conductor bodies attached adhesive sheet) according to a first embodiment of the present invention, FIG. 2 is a schematic plane view of a conductor bodies attached adhesive sheet according to the same embodiment, FIG. 3 is a schematic perspective view of when sticking the conductor bodies attached adhesive sheet according to the same embodiment and a semiconductor wafer, FIG. 4 is a schematic cross-sectional view of a state where the conductor bodies attached adhesive sheet according to the same embodiment and a semiconductor wafer are stuck, and FIG. 5 is a schematic cross-sectional view of a state where an adhesive agent layer of the conductor bodies attached adhesive sheet according to the same embodiment and a substrate are aligned (furthermore, a state where the semiconductor wafer and the substrate are adhered).

Configuration of Conductor Bodies Attached Adhesive Sheet 1

As shown in FIG. 1 and FIG. 2, a conductor bodies attached adhesive sheet 1 according to a first embodiment of the present invention comprises a base material 2, an adhesive agent layer 3 formed on the base material 2, and a plurality of conductor bodies 4 buried in the adhesive agent layer 3. The adhesive agent layer 3 has a same shape as that of a semiconductor wafer 5 shown in FIG. 3, which is a disk shape being formed a cut off portion (orientation flat). Note that the cut off portion may be a notch other than an orientation flat.

As shown in FIG. 1, an upper end of each of the conductor bodies 4 is positioned on a front surface of the adhesive agent layer 3, and an lower end thereof is positioned on a back surface of the adhesive agent layer 3. The conductor bodies 4 buried in the adhesive agent layer 3 in the above way are arranged in a pattern corresponding to an arrangement of electrodes of a plurality of semiconductor integrated circuits formed on the semiconductor wafer 5 (FIG. 2).

Adhesive Agent Layer 3

The adhesive agent layer 3 is comprised of an adhesive agent having gradable adhesiveness. The adhesive agents which exhibit gradable adhesiveness include those having a stage of tackiness (removable adhesiveness) and a stage of adhesiveness (a so-called tacky adhesive agent) and also include those which do not exhibit any tackiness/adhesiveness in a normal state but exhibit gradable tackiness/adhesiveness by a heat, compression or other triggers.

The adhesive agent layer 3 preferably has a function as a so-called under filling material, that is, it is preferable to have a coefficient of linear expansion close to those of the semiconductor wafer 5 (or a semiconductor chip), substrate 6 and conductor bodies 4 when it finally hardens.

An adhesive agent (tacky adhesive agent) of the former type may be, for example, a composition (a) containing a thermosetting resin and a tacky component, while an adhesive agent of the latter type may be, for example, a polyimide type resin (b) and an epoxy type resin (c), etc. The resins or the resin compositions may be used alone, or a material wherein the resin or the resin composition is used as a matrix can be also used. Note that a thickness of the adhesive agent layer 3 is normally determined in accordance with a height of the conductor bodies 4.

a. Composition Containing Thermosetting Resin and Tacky Component

In a composition containing a thermosetting resin and an tacky component, mainly the thermosetting resin exhibits adhesiveness and the tacky component exhibits tackiness. Examples of the thermosetting resin in such a composition include an epoxy resin, a phenol resin, an urea resin, a melanin resin, an unsaturated polyester resin, a resorcinol resin, a furan resin, a polyurethane resin, a silicone resin etc. An epoxy resin is preferable among them. On the other hand, examples of the tacky component include an acrylic type adhesive, a rubber type adhesive, a polyester type adhesive, or thermoplastic resins such as polyolefin, polyvinyl chloride, polystyrene, thermoplastic polyamide and polyester. A photopolymerizable composition may be included therein. As such a tacky component, a (meth)acrylate copolymer is preferable.

Particularly preferable composition containing a thermoplastic resin and a tacky component is a composition (hereinafter, also referred to as "composition A") containing a (meth)acrylate copolymer having a weight-average molecular weight of not less than 30000, an epoxy resin having a weight-average molecular weight of 100 to 10000, a photopolymerizable low molecular compound and thermal activation latent epoxy resin curing agent.

The (meth)acrylate copolymer having a weight-average molecular weight of not less than 30000 may be a copolymer obtained by copolymerizing monomers, such as, (meth) acrylic acid, for example, alkyl (meth)acrylate derived from (meth)acrylic acid and alcohol having a carbon number of 1 to 14, hydroxyethyl (meth)acrylate, glycidyl (meth)acrylate, etc. A copolymer of (meth)acrylic acid and/or glycidyl (meth)acrylic acid and at least one kind of alkyl (meth) acrylate is preferable among them.

Examples of alkyl (meth)acrylate derived from (meth) acrylic acid and alcohol having a carbon number of 1 to 14 include methyl (meth)acrylate, ethyl (meth)acrylate, butyl (meth)acrylate, etc.

When using a copolymer derived from (meth)acrylic acid and/or glycidyl (meth)acrylic acid as a (meth)acrylate copolymer, a content of a component unit derived from glycidyl (meth)acrylic acid in the copolymer is normally made to be 0 to 80 mol %, preferably 5 to 50 mol %, and a content of a component unit derived from (meth)acrylic acid is normally made to be 0 to 40 mol %, preferably 5 to 20 mol %. In this case, as monomer components other than (meth) acrylic acid and glycidyl (meth)acrylic acid constituting (meth)acrylate copolymer, it is preferable to use alkyl (meth) acrylate, such as, methyl (meth)acrylate, ethyl (meth) acrylate, butyl (meth)acrylate, etc.

An epoxy resin having a weight-average molecular weight of 100 to 10000 may be glycidyl ether of a phenol series, such as, bisphenolA, bisphenolF, resorcinol, phenyl novolac, cresol novolac; glycidyl ether of an alcohol series, such as, butanediol, polyethylene glycol, polypropylene glycol; glycidyl ether of carboxylic acid, such as, phthalic acid, isophthalic acid, tetrahydro phthalic acid; a glycidyl type or alkyl glycidyl type epoxy resin obtained by substituting active hydrogen bonded with nitrogen atom, such as, aniline isocyanurate, with a glycidyl group; and so-called alicycle epoxide wherein an epoxy group is introduced by, for example, oxidizing carbon-carbon double bond in molecular, such as, vinyl cyclohexene epoxide, 3,4-epoxy cyclohexyl methyl-3,4-dicyclohexane carboxylate, 2-(3,4-epoxy) cyclohexyl-5,5-spiro (3,4-epoxy) cyclohexane-m-dioxane, etc.

An epoxy equivalent weight of the above epoxy resins is preferably 50 to 5000 g/eq. The above epoxy resins may be used alone or by combining different kinds. Among these epoxy resins, bisphenol series glycidyl type epoxy resin, o-cresol novolac type epoxy resin and phenol novolac type epoxy resin are preferably used.

The above epoxy resins are used in an amount of a range of normally 5 to 2000 parts by weight, preferably 100 to 1000 parts by weight with respect to 100 parts by weight of (meth)acrylate copolymer.

A photopolymerizable low molecular compound is a compound able to be crosslinked by being irradiated an energy rays, such as, ultraviolet rays, electron rays, etc. As such a compound, oligomer wherein there is at least one photopolymerizable double bond in molecular and a weight-average molecular weight (Mw) is in a range of 100 to 30000, preferably 300 to 10000 may be used.

Example of a photopolymerizable low molecular compound may be urethane modified acrylate, epoxy modified acrylate, polyester acrylate, polyether acrylate; (meth) acrylic acid oligomer, itaconic acid oligomer and other oligomers having a functional group, such as hydroxy group or carboxyl group. Epoxy modified acrylate and urethane modified acrylate are preferably used among these.

Note that different points between the above photopolymerizable low molecular compound and the above (meth)acrylate copolymer or an epoxy resin are that an upper limit of a weight-average molecular weight of the photopolymerizable low molecular compound is 30000 while that of the above (meth)acrylate copolymer is not less than 30000, and that the photopolymerizable low molecular compound always has at least one photopolymerizable double bond in its molecular while the above (meth)acrylate copolymer and epoxy resin normally do not have photopolymerizable double bond.

The above photopolymerizable low molecular compound is used in an amount of a range of normally 10 to 1000 parts by weight, preferably 50 to 600 parts by weight with respect to 100 parts by weight of (meth)acrylate copolymer.

When using ultraviolet rays for crosslinking the above photopolymerizable low molecular compound, it is preferable that a photopolymerizing initiator is blended in the composition A. A photopolymerizing initiator may be benzophenone, acetophenone, benzoin, benzoin alkyl ether, benzil, benzildimethyl ketal, etc. These photopolymerizing initiators maybe used alone or by combining different kinds. It is preferable to use α-substituted acetophenone among these.

The above photopolymerizing initiator is used in an amount of a range of normally 0.1 to 10 parts by weight, preferably 1 to 5 parts by weight with respect to 100 parts by weight of a photopolymerizable low molecular compound.

A thermal activation latent epoxy resin curing agent is a curing agent of a type that does not react with epoxy resins at a room temperature but activates by a heat of a certain temperature or more and reacts with epoxy resins. As kinds (divided by activation processes) of thermal activation latent epoxy resin curing agents, there are those which generate active species (anion, cation) by a chemical reaction due to heating, those which are stably dispersed in an epoxy resin around a room temperature but become compatible and dissolved in an epoxy resin at a high temperature to start a curing reaction, those which are a type of curing agent contained in molecular sieves which is released at a high temperature to start a curing reaction, and those encapsulated inamicro-capsule, etc. These thermal activation latent epoxy resin curing agents can be used alone or by combining different kinds, and among these, it is preferable to use dicyanamide, imidazole compound, or a mixture of the dicyanamide and imidazole compound.

The above thermal activation latent epoxy resin curing agents are used in an amount of a range of normally 0.1 to 40 parts by weight, preferably 1 to 30 parts by weight with respect to 100 parts by weight of an epoxy resin.

Note that a thermo-curing agent, such as polyisocyanate compound, other than the above thermal activation latent epoxy resin curing agents may be blended so as to change an adhesion ability of the compound A. The thermo-curing agent is used in an amount of a range of normally 0.1 to 30 parts by weight, preferably 5 to 20 parts by weight with respect to 100 parts by weight of (meth)acrylate copolymer.

b. Polyimide Type Resin

Examples of a polyimide type resin include a polyimide resin, a polyisoimide resin, maleimide resin, a bismaleimide resin, a polyamide-imide resin, a polyetherimide resin, a poly-imide-isoindoloquinazolinedioneimide resin, etc. These polyimide type resins may be used alone or by combining different kinds. It is preferable to use a polyimide resin among these. Furthermore, in polyimide resins, there are thermoplastic polyimide resins which do not have a reactive functional group and thermosetting polyimide resins which show an imidation reaction by heating. Any of these may be used or the both may be mixed to be used.

A weight-average molecular weight of polyimide type resins is preferably about 10,000 to 1,000,000, particularly about 50,000 to 100,000.

c. Epoxy Type Resin

As an epoxy type resin, those similar to the epoxy resins of the above composition A may be used. The weight-average molecular weight is preferably about 100 to 100,000.

The above resins or resin compositions may be blended additives, such as, a leuco dye, an antistatic agent, a coupling agent, an ion scavenger and a copper inhibitor, and other polymers, oligomers and low molecular compounds, etc.

As a leuco dye, 3-[N-(P-tolylamino)-7-anilinofluoran, 4,4',4"-trisdimethylamino triphenylmethane, etc. may be used, and as an antistatic agent, carbon black, anion type and cation type surface-active agents, etc. may be used.

Also, other polymers, oligomers and low molecular compounds may be, for example, a variety of polymers or oligomers, such as, an epoxy resin, an amide resin, an urethane resin, an amide acid resin, a silicone resin, an acrylic resin and acrylic rubber; and nitrogen-contained organic compounds, such as, triethanolamine, α,ω-(bis3-aminopropyl) polyethylene glycol ether.

Incidentally, to provide a function of an under filling material to the adhesive agent layer 3, those which have the above linear expansion coefficient when finally hardened may be selected as an adhesive agent constituting the adhesive agent layer 3, and it is also possible to make a material have the above linear expansion coefficient when it is finally hardened by adding an inorganic filler, etc. to the adhesive agent as a matrix.

An inorganic filler may be a fused silica, crystal silica, almina, boron nitride, aluminum nitride, silicon nitride, magnesia, magnesium silicate, etc., and ones being spherical are preferable. A blending amount and particle diameter of an inorganic filler with respect to a matrix may be suitably adjusted and selected so that the adhesive agent layer 3 has a desired linear expansion coefficient and is not restrained in terms of fluidity as in an under filling agent of the related art.

Note that when filling up the above composition A with a light scattering inorganic filler, such as silica powder and almina powder, a photopolymerizable low molecular compound in the composition A can be efficiently polymerized by irradiating a light.

Base Material 2

Any material would be basically sufficient as a base material 2 in the present embodiment as far as it supports the adhesive agent layer 3 and is able to be removed from the adhesive agent layer 3, and it may also have stiffness.

Examples of the base material 2 include films made by resins, such as, polyethylene, polypropylene, polybutene, polybutadiene, vinyl chloride, ionomer, ethylene-methacrylic acid copolymer, polyethylene terephthalate, polyethylene naphthalate, polybutylene terephthalate, polyimide, polyetherimide, polyaramide, polyetherketone, polyether ether ketone, polyphenylene sulfide, poly (4-methylpentene-1), polytetrafluoroethylene, and those obtained by crosslinking these resins. These films may be used alone or by laminating different kinds. A film thickness thereof is normally about 10 to 300 $\mu$m, preferably 20 to 150 $\mu$m.

Also, other than the above films, papers, such as, a glassine paper, clay coated paper, resin coated paper, a laminated paper (polyethylene laminated paper, polypropylene laminated paper, etc.) or nonwoven fabrics, metallic foils, etc. may be used.

A surface tension of a surface of the base material 2 on which the adhesive agent layer 3 is formed is preferably not more than 40 dyn/cm. Release treating may be performed on the surface of the base material 2 on which the adhesive agent layer 3 is formed to adjust the surface tension to be a preferable value. Alkyd resin type, silicone resin type, fluorine resin type, unsaturated polyester resin type, polyolefin resin type and wax type releasing agents, etc. may be used for the release treating. Note that when the base material 2 itself has the above surface tension, the base material 2 can be used as it is without any release treating.

When using the above composition A for the adhesive agent layer 3, it is preferable to use as the base material 2 a material wherein an energy rays to be irradiated on the composition A can permeate, and it is particularly preferable to use a material having a low adhesiveness to the composition A having improved tackiness due to the energy rays irradiation.

On the other hand, when a polyimide type resin or an epoxy type resin is used for the adhesive agent layer 3, it is preferable to use as the base material 2 a film made of a heat resistance resin. A fusing point of the heat resistance resin is preferably not less than 230° C., more preferably 250 to 300° C., and particularly preferably 260 to 280° C.

When producing a semiconductor device by using the present conductor bodies adhesive sheet 1, dicing of a semiconductor wafer can be also performed. In this case, spaces between semiconductor chips may be made wider by expanding the base material 2 after dicing. As the base material 2 able to be expanded in this way, it is preferable to select a resin film having a extensible property in the length and width directions and a Young's modulus of $1.0 \times 10^4$ kg/cm$^2$ or less.

Conductor Bodies 4

The conductor bodies 4 are not particularly limited as far as it is normally used as bumps (electrodes) in a semiconductor device. As a material of the conductor bodies 4, metals or alloys of solder, Au, Cu, Ni, Ag, Pt, etc., resins plated by these metals or alloys, resins wherein conductive powder is dispersed, conductive resins, etc. is normally selected. In the present embodiment, a shape of the conductor bodies 4 is sphere, but it is not limited to this and may have a columnar shape, prismatic shape or conical shape, etc. The conductor bodies 4 may be such a shape from the beginning or may be made to be the spheric shape or other shape by being printed a conductive paste.

A height of the conductor bodies 4 is normally 50 to 300 $\mu$m, but it may be less than 50 $\mu$m, or furthermore, 30 $\mu$m or less. In the present embodiment, the height of the conductor bodies 4 is the same as the thickness of the adhesive agent layer 3.

Note that a pattern of the conductor bodies 4 in the present embodiment is a pattern corresponding to a so-called area type semiconductor chip on which electrodes are formed all over the chip, but the present invention is not limited to this pattern. It may be a pattern corresponding to a so-called peripheral type semiconductor chip wherein electrodes are formed around the chip.

Production of Conductor Bodies Attached Adhesive Sheet 1

A process for producing the above a conductor bodies attached adhesive sheet 1 is not particularly limited, but generally, after printing conductor bodies 4 by a predetermined pattern on the base material 2, an adhesive agent is coated to form the adhesive agent layer 3 on the base material 2. As a printing method of the conductor bodies 4, screen printing or a process for injecting the conductor bodies 4 by an ink-jet method, etc. are applied. On the other hand, as a method of coating the adhesive agent, screen process printing, roll coating, knife coating and micro-die methods, etc. are applied.

Note that when preparing and coating the above adhesive agent, a solvent wherein respective components of the adhesive agent can be uniformly dissolved and dispersed can be also used. The solvent is not particularly limited as far as it is capable of uniformly dissolving and dispersing the respective components therein. Examples of the solvent include dimethylformamide, dimethylacetoamide, N-methyl-pyrrolidone, dimethyl sulfoxide, diethylene glycol dimethyl ether, toluene, benzene, xylene, methyl ethyl ketone, tetrahydrofuran, ethyl-cellosolve, dioxane, cyclopentanone, cyclohexanone, monoglyme, etc. These solvents can be used alone or by being mixed with different kinds.

On the other hand, the above conductor bodies attached adhesive sheet 1 may be produced by forming the adhesive agent layer 3 by coating an adhesive agent on the base material 2, then burying the conductor bodies 4 in the adhesive agent layer 3 in a predetermined pattern. As a method of burying the conductor bodies 4, a method of pressing one obtained by forming the conductor bodies 4 on a sheet or adsorbing the conductor bodies 4 on a jig in a predetermined pattern and one obtained by forming the adhesive agent layer 3 on a sheet so as to bury the conductor bodies 4 in the adhesive agent layer 3, a method of process injecting the conductor bodies 4 to the adhesive agent layer 3 by an ink-jet method, etc. may be applied.

In any of the above methods, the conductor bodies 4 may be buried in the adhesive agent. In this case, the upper end and the lower end of the conductor bodies 4 may be positioned on the front surface and back surface of the adhesive agent layer 3 by pressing at the time of adhering a protective film.

Note that a plurality of adhesive agent layers 3 may be formed by being set beside each other on one base material 2.

Producing Semiconductor Device

A process for producing a semiconductor device by using the above conductor bodies attached adhesive sheet 1 will be explained.

First, as shown in FIG. 3, a semiconductor wafer 5 is put on the adhesive agent layer 3 of the conductor bodies attached adhesive sheet 1 and the two are stuck to each other. At this time, as shown in FIG. 4, the semiconductor wafer is aligned so that an electrodes 51 of a semiconductor integrated circuit formed on the semiconductor wafer 5 and the conductor bodies 4 can be electrically connected, and the semiconductor wafer 5 and the adhesive agent layer 3 of the conductor bodies attached adhesive sheet 1 are stuck to each other.

Note that in the conductor bodies attached adhesive sheet 1 of the present embodiment, since the upper end of the conductor bodies 4 is positioned at the surface of the adhesive agent layer 3, the electrodes 51 of the semiconductor wafer 5 and the conductor bodies 4 can be electrically connected by sticking the aligned semiconductor wafer 5 to the adhesive agent layer 3. Incidentally, the electrodes 51 of the semiconductor wafer 5 may be those called bonding pads or conductor bodies pads, and may be barrier metal formed thereon, furthermore, pillars.

When the adhesive agent layer 3 of the conductor bodies attached adhesive sheet 1 has tackiness, the above sticking can be attained by an adhesion force of the tackiness. When the adhesive agent layer 3 does not have any tackiness, it is preferable to stick the adhesive agent layer 3 and the semiconductor wafer 5 by hot pressing. The heating temperature of the hot pressing is preferably about 30 to 300° C., particularly preferably about 50 to 200° C., the heating time is preferably about 1 second to 10 minutes, particularly preferably about 1 to 30 seconds, and the pressure is preferably about 1 to 10 kg/cm$^2$, particularly preferably about 1 to 5 kg/cm$^2$.

After sticking the semiconductor wafer 5 and the conductor bodies attached adhesive sheet 1, dicing of the semiconductor wafer 5 may be performed if needed. At this time, dicing may be performed by additionally preparing a wafer dicing sheet, removing the base material 2 from the conductor bodies attached adhesive sheet 1 and sticking the wafer dicing sheet to the adhesive agent layer 3 of the conductor bodies attached adhesive sheet 1, or by without using a wafer dicing sheet as such.

After the above dicing, spaces between semiconductor chips may be made wide by expanding in accordance with need. When the wafer dicing sheet is used, the wafer dicing sheet can be expanded, and even when such a wafer dicing sheet is not used, if a base material 2 able to be expanded is used, the base material 2 may be expanded.

Incidentally, when using the above composition A for the adhesive agent layer 3 of the conductor bodies attached adhesive sheet 1, it is preferable to irradiate an energy rays from the base material 2 side of the conductor bodies attached adhesive sheet 1 to the adhesive agent layer 3. As the energy rays, ultraviolet rays having a center wavelength of about 365 nm and electron rays, etc. may be used.

When using ultraviolet rays as the energy rays, normally, the illuminance is set in a range of 20 to 500 mW/cm$^2$ and the irradiation time is set in a range of 0.1 to 150 seconds. Also, for example when using electron rays, conditions can be set conforming to the case of ultraviolet rays. Note that heating may be also auxiliary performed at the time of irradiating the above energy rays.

By irradiating energy rays as such, an adhesion force between the semiconductor wafer 5 (or a semiconductor chip) and the adhesive agent layer 3 is normally improved to 50 to 4000 g/25 mm, preferably 100 to 3000 g/25 mm. On the other hand, an adhesion force between the adhesive agent layer 3 and the base material 2 normally declines to 1 to 500 g/25 mm, preferably 100 g/25 mm or less.

Then, the base material 2 is removed from the above adhesive agent layer 3 of the conductor bodies attached adhesive sheet 1. Incidentally, when using the above composition A for the adhesive agent layer 3 of the conductor bodies attached adhesive sheet 1 and the irradiation of an energy rays is performed as above, the base material 2 can be surely removed while leaving the adhesive agent layer 3 fixed on the semiconductor wafer 5 (or a semiconductor chip) side. Note that the irradiation of the energy rays may be performed before a dicing process.

As shown in FIG. 5, alignment (superimposition) of the semiconductor wafer 5 (or a semiconductor chip) with a substrate 6 is performed so that electrodes 61 formed on the substrate 6 and conductor bodies 4 are electrically connected.

Note that since a lower end of the conductor bodies 4 is positioned on the back surface of the adhesive agent layer 3 in the conductor bodies attached adhesive sheet 1 of the present embodiment, the conductor bodies 4 and the electrodes 61 of the substrate 6 can be electrically connected by the aligning of the semiconductor wafer 5 (or a semiconductor chip).

The semiconductor wafer 5 (or a semiconductor chip) and the substrate 6 are adhered via the adhesive agent layer 3. The adhesion process can be generally performed by heating. The heating is preferably performed during superimposing the substrate 6 and the semiconductor wafer 5 (or a semiconductor chip) or immediately after the superimposition. At this time, when the adhesive agent layer 3 does not have any tackiness, a temporary adhesion is preferably performed before an actual adhesion.

A heating temperature of the temporary adhesion is normally 100 to 300° C., preferably 150 to 250° C., a heating time is normally 1 second to 10 minutes, preferably 1 to 30 seconds, while a heating temperature of the actual adhesion is normally 100 to 300° C., preferably 150 to 250° C. and a heating time is normally 1 to 120 minutes, preferably 1 to 60 minutes. By heating in this way, an adhesive agent of the adhesive agent layer 3 is fused or hardened so that the semiconductor wafer 5 (or a semiconductor chip) and the substrate 6 are firmly adhered.

During the above heating, the semiconductor wafer 5 (or a semiconductor chip) and the substrate 6 may be pressed to adhere by applying a suitable pressure in the thickness direction of a laminate formed by the semiconductor wafer 5 (or a semiconductor chip), the adhesive agent layer 3, and the substrate 6. As a result of the pressing, electrodes 51 of the semiconductor wafer 5 (or a semiconductor chip) and the conductor bodies 4 can be surely connected and the conductor bodies 4 and the electrodes 61 of the substrate 6 can be surely connected. The pressing is particularly efficient in the case where an upper end and/or lower end of the conductor bodies 4 is not appeared on the surface of the insulative adhesive agent layer 3 in the conductor bodies attached adhesive sheet 1.

Incidentally, when a fusing point of the conductor bodies 4 is lower than the above heating temperature, for example when the conductor bodies 4 are made of solder balls or a resin, the conductor bodies 4 are fused or soften to deform in some cases.

When the semiconductor wafer 5 is not cut yet, the result obtained by adhering the semiconductor wafer 5 and the substrate 6 may be cut and chipped to be a semiconductor device 7, or those in a wafer size may be used as semiconductor devices 7 without cutting. Cutting can be performed by a dicing saw and other normal cutting means. Thus cut results become so-called real chip size package type semiconductor devices.

In the process for producing a semiconductor device as explained above, a conductor bodies attached adhesive sheet 1 was stuck to a semiconductor wafer 5 and then a substrate 6 was adhered thereto, but the present invention is not limited to this. The conductor bodies attached adhesive sheet 1 may be adhere to the substrate 6 and then the semiconductor wafer 5 is adhered thereto.

In the semiconductor device 7 obtained as above, since the conductor bodies 4 are buried in the adhesive agent layer 3 in advance and the adhesive agent layer 3 serves as an under filling material, a process of injecting an under filling material to a space between the semiconductor wafer 5 (or a semiconductor chip) and the substrate 6 becomes unnecessary. Accordingly, any defects caused by fluidity of an under filling material does not exist in thus obtained semiconductor device 7.

[Second Embodiment]

Figure 6:
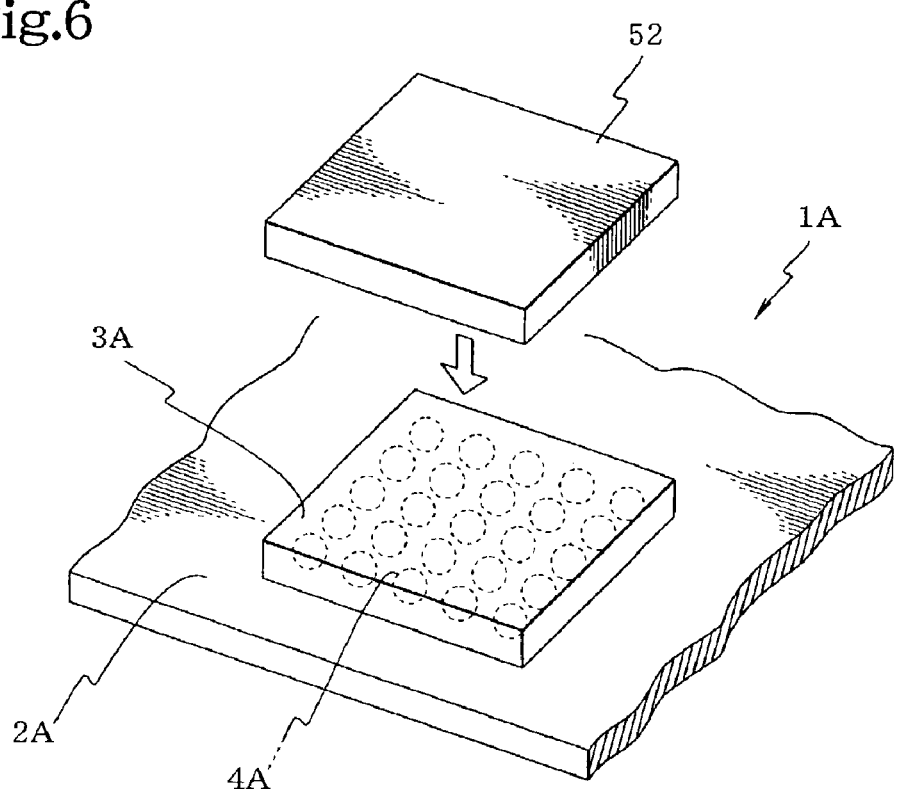
FIG. 6 is a schematic perspective view of when adhering a conductor bodies attached adhesive sheet according to another embodiment of the present invention and a semiconductor chip.

A conductor bodies attached adhesive sheet according to a second embodiment of the present invention will be explained. FIG. 6 is a schematic perspective view of when sticking the conductor bodies attached adhesive sheet according to the second embodiment of the present invention and a semiconductor chip.

As shown in FIG. 6, a conductor bodies attached adhesive sheet 1A according to the second embodiment comprises, as same as the conductor bodies attached adhesive sheet 1 according to the first embodiment, a base material 2A, an adhesive agent layer 3A formed on the base material 2A, and a plurality of conductor bodies 4A buried in the adhesive agent layer 3A, but differs from the conductor bodies attached adhesive sheet 1 according to the first embodiment in the point that the adhesive agent layer 3A is formed to be a same shape as that of a semiconductor chip 52. Note that the conductor bodies 4A buried in the adhesive agent layer 3A are arranged in a pattern corresponding to an arrangement of electrodes of a semiconductor integrated circuit formed on the semiconductor chip 52.

The conductor bodies attached adhesive sheet 1A according to the second embodiment can be produced in a similar process to in the conductor bodies attached adhesive sheet 1 according to the first embodiment, and a plurality of adhesive agent layers 3 may be formed by being set beside each other on one base material 2A.

Also, in the case of producing a semiconductor device by using the conductor bodies attached adhesive sheet 1A according to the second embodiment, a semiconductor device can be produced in a similar process to in the conductor bodies attached adhesive sheet 1 according to the first embodiment except that a dicing process and a process of cutting a result obtained by adhering the semiconductor wafer and the substrate are unnecessary.

[Third Embodiment]

Figure 7:
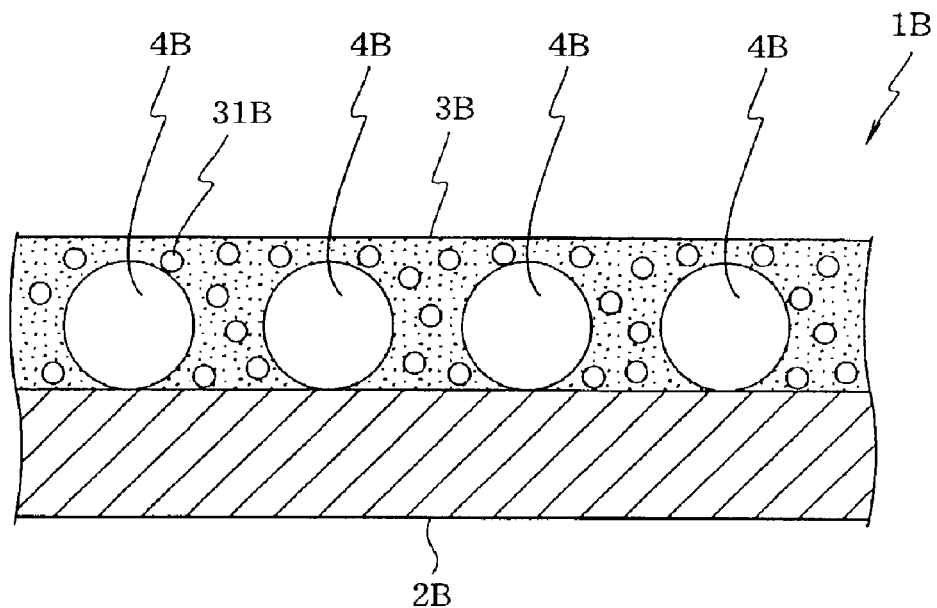
FIG. 7 is a schematic cross-sectional view of a conductor bodies attached adhesive sheet according to another embodiment of the present invention.
Figure 8:
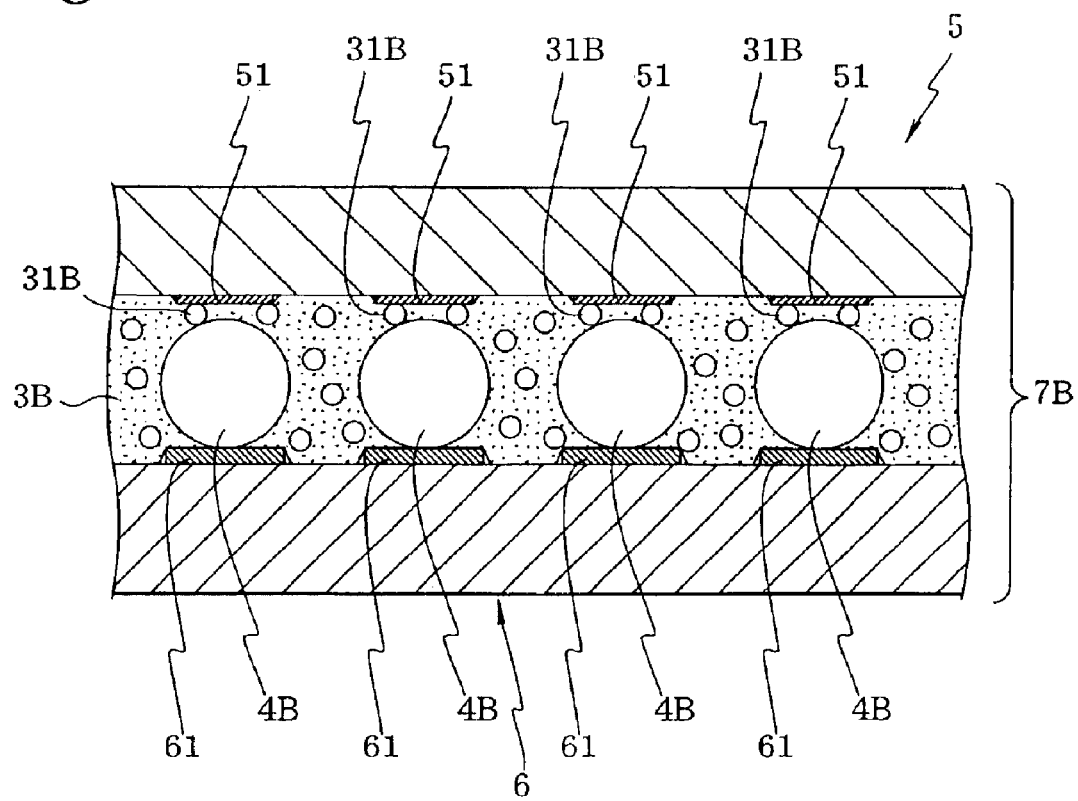
FIG. 8 is a schematic cross-sectional view of a state where a semiconductor wafer and a substrate are adhered via the adhesive agent layer of the conductor bodies attached adhesive sheet according to the same embodiment.

A conductor bodies attached adhesive sheet according to a third embodiment of the present invention will be explained. FIG. 7 is a schematic sectional view of the conductor bodies attached adhesive sheet according to the third embodiment and FIG. 8 is a schematic sectional view of a state where a semiconductor wafer and a substrate are adhered via an adhesive agent layer of the conductor bodies attached adhesive sheet according to the third embodiment.

As shown in FIG. 7, a conductor bodies attached adhesive sheet 1B according to the third embodiment of the present invention comprises a base material 2B, an adhesive agent layer 3B formed on the base material 2B and a plurality of conductor bodies 4B buried in the adhesive agent layer 3B. An upper end of each of the plurality of conductor bodies 4B in the present embodiment is positioned lower than a surface of the adhesive agent layer 3B (actually buried in the adhesive agent layer 3B) and a lower end of each of the conductor bodies 4B is positioned on a back surface of the adhesive agent layer 3B. However, the present invention is not limited to this and the lower ends of the conductor bodies may positioned upper than the back surface of the adhesive agent layer 3B and the upper ends thereof may be positioned on the surface of the adhesive agent layer 3B. Alternately, the conductor bodies 4B may be completely buried in the adhesive agent layer 3B.

The adhesive agent layer 3B in the present embodiment has an isotropic conductivity, that is, it exhibits conductivity in the thickness direction when being pressed in the thickness direction, but has an insulation property in the surface direction. For that property, conductive particles 31B are dispersed in an insulative matrix in the adhesive agent layer 3B.

As such conductive particles 31B, particles made of a metal having an excellent conductivity, such as Ni, Ag, Au, Cu, solder, etc., polymer particles covered with the metals, or these metal particles or metal covered particles on which an extremely thin organic insulation layer is formed so as to improve the insulation property in the surface direction may be used.

To secure the an isotropic conductivity, an average particle diameter of the conductive particles 31B is preferably 1 to 100 $\mu$m, and a dispersion amount of the conductive particles 31B is preferably 1 to 30 vol % with respect to the matrix.

The conductor bodies attached adhesive sheet 1B according to the third embodiment can be produced in a similar process to in the conductor bodies attached adhesive sheet 1 according to the first embodiment. Also, when producing a semiconductor device by using the conductor bodies attached adhesive sheet 1B according to the third embodiment, it can be produced in a similar process to in the conductor bodies attached adhesive sheet 1 according to the first embodiment except for applying a suitable pressure in the thickness direction of the semiconductor wafer 5 (or a semiconductor chip) and the adhesive agent layer 3B and letting conductivity appear in the thickness direction of the adhesive agent layer 3B.

In a semiconductor device 7B produced by using the conductor bodies attached adhesive sheet 1B according to the third embodiment, as shown in FIG. 8, electrodes 51 of the semiconductor wafer 5 (or a semiconductor chip) and electrodes 61 of the base material 6 are electrically connected via the conductor bodies 4B and conductive particles 31B.

[Other Embodiment]

The embodiments explained above are described for easier understanding of the present invention and not to limit the present invention. Accordingly, elements disclosed in the above embodiments include all design modifications and equivalents belonging to the scope of the present invention.

For example, the base materials 2, 2A and 2B may have the same shape as that of the adhesive agent layers 3, 3A and 3B.

As explained above, according to the present invention, a semiconductor having no defects caused by fluidity of an under filling material can be obtained. Namely, the present invention is useful in producing a semiconductor device having no defects caused by fluidity of an under filling material.

EXAMPLES

Below, the present invention will be explained further in detail by examples, but the scope of the present invention is not limited to the examples.

Example 1

Production of Solder Ball Attached Adhesive Sheet (Adhesive Agent: Composition A)

A copolymer having an weight average molecular weight of 900,000 was prepared by copolymerizing 55 parts by weight of butyl acrylate, 10 parts by weight of methylmethacrylate, 20 parts by weight of glycidyl methacrylate and 15 parts by weight of 2-hydroxyethyl acrylate.

A composition A was obtained by mixing 10 parts by weight of the above copolymer, 24 parts by weight of liquid bisphenol A type epoxy resin (Epikote 828 produced by Yuka Shell Epoxy Co., Ltd), 10 parts by weight of o-cresol novolac type epoxy resin (EOCN-104S produced by NIPPON KAYAKU Co., Ltd.), 0.05 part by weight of γ-glycidoxypropyltrimethoxysilane as a coupling agent, 1.5 part by weight of dicyandiamide as a thermal activation latent curing agent, 1.5 part by weight of 2-phenyl-4,5-hydroxymethylimidazole, 5 parts by weight of urethane acrylate type oligomer (Seikabeam 14-29B produced by Dainichiseika Color & Chemicals Mfg. Co., Ltd.) as a photopolymerizable low molecular compound, 0.2 part by weight of 1-hydroxycyclohexyl phenyl ketone as a photopolymerization initiator and 1 part by weight of aromatic polyisocyanate (Colonate L produced by Nippon Polyurethane Industry Co., Ltd.) as a crosslinking agent.

Spheric conductor bodies having a diameter of 200 μm were formed in the same arrangement of electrodes of a semiconductor integrated circuit by using as a release film a polyethylene terephthalate (PET) film having a thickness of 38 μm, one surface of which was releasing treated by a siliconeresin, and by printing a conductive paste (DW-250H-5 produced by TOYOBO Co., Ltd.) on the releasing treated surface of the release film by screen printing. After that, the above composition A was coated by screen printing and dried at 100° C. for 5 minutes to form an adhesive agent layer, a polyethylene film (thickness: 100 μm, surface tension: 36 dyn/cm) was stuck as a base material on the surface of the adhesive agent layer, and a conductor bodies attached adhesive sheet wherein a thickness of an adhesive agent layer was 200 μm was obtained. The conductor bodies attached adhesive sheet was made to be a wafer form by punching. Also, a conductor bodies attached adhesive sheet of a chip size was prepared separately in a similar way.

Example 2

Production of Conductor Bodies Attached Adhesive Sheet (Adhesive Agent: Polyimide Type Resin)

Spheric conductor bodies having a diameter of 200 μm were formed in the same arrangement of electrodes of a semiconductor integrated circuit by using as a base material polyethylene naphthalate (PEN) film (thickness: 25 μm, surface tension: 34 dyn/cm), one surface of which was releasing treated by a silicon resin, and by printing a conductive paste (DW-250H-5 produced by TOYOBO Co., Ltd.) on the releasing treated surface of the base material by screen printing. After that, a tetrahydrofuran solution (solid content: 20 wt %) of thermoplastic polyimide (Upitite UPA-N221 produced by Ube Industries Ltd.) was coated to be a wafer shape by screen printing, dried at 90° C. for 5 minutes to form an adhesive agent layer having a thickness of 200 μm. Thus, a conductor bodies attached adhesive sheet was obtained.

Example 3

Production of Conductor Bodies Attached Adhesive Sheet (Adhesive Agent: Epoxy Type Resin Composition)

An epoxy type resin adhesive agent was prepared by mixing 40 parts by weight of a high molecular bisphenol type epoxy resin (Epikote 1010 produced by Yuka Shell Epoxy Co., Ltd), 20 parts by weight of a multifunctional cresol novolac type epoxy resin (EOCN-4600 produced by Nippon Kayaku Co., Ltd.), 1.5 parts by weight of 2-phenyl-4,5-hydroxymethylimidazole as a thermal activation latent curing agent, and 0.1 part by weight of γ-glycidepropyltrimethoxysilane.

A PET film (thickness: 38 μm, surface tension: 34 dyn/cm), of which one surface was releasing treated by a silicone resin was used as a base material, the above epoxy type resin adhesive agent was coated to be a wafer shape by screen printing on the releasing treated surface of the base material to form an adhesive agent layer. On the other hand, suction was performed from a back surface of a jig having holes in the same arrangement as that of electrodes of a semiconductor integrated circuit so as to adsorb solder balls (Pb-63Sn) having a diameter of 200 μm as conductor bodies into respective holes to be made aligned. By stopping the suction after pressing the jig against the above adhesive agent layer, the conductor bodies were buried in the adhesive agent layer. Then, the adhesion agent layer was dried at 100° C. for 5 minutes so that a conductor bodies attached adhesion sheet wherein a thickness of the adhesive agent layer was 200 μm was obtained.

Example 4

Production of Conductor Bodies Attached Adhesive Sheet (Adhesive Agent: Anisotropic Conductive Adhesive Agent)

10 parts by weight of conductive particles (silver particles, average diameter: 3 μm) were mixed and dispersed to a hundred parts by weight of thermosetting resin which is obtained by mixing a hundred parts by weight of bisphenol A type epoxy resin (RE-310S produced by Nippon Kayaku Co., Ltd.), 20 parts by weight of a first curing agent (Cureduct P-0505 produced by Shikoku Chemicals Corp.) and 10 parts by weight of second curing agent (Cureduct L-01B produced by Shikoku Chemicals Corp.) as an imidazole series adduct type latent curing agent to prepare an anisotropic conductive adhesive agent.

A conductor bodies attached adhesive sheet was prepared in a similar way to in the example 3 except that the above anisotropic conductive adhesive agent was used as an adhesive agent.

Example 5

Production of Semiconductor Device (Adhesive Sheet: Example 1)

A conductor bodies attached adhesive sheet in a wafer shape prepared in the example 1 (wherein an adhesive agent layer was exposed by removing a PET film as a release film. The following will be the same.) and a semiconductor wafer were aligned so that the conductor bodies of the conductor bodies attached adhesive sheet were electrically connected to electrodes of a semiconductor integrated circuit formed on the semiconductor wafer, and the conductor bodies attached adhesive sheet was stuck to the semiconductor wafer. They were fixed to a ring frame.

After irradiating ultraviolet rays (ADWILL RAD-2000m/8 produced by Lintec Corporation was used. irradiation conditions: luminance was 340 mW/cm$^2$, irradiation time was 6 seconds. The following will be in the same way) to the above adhesive agent layer, full-cut dicing was performed up to the adhesive agent layer by using adicing saw (AWD-4000B produced by Tokyo Seimitsu Co., Ltd.) and thus obtained adhesive agent layer attached chip was picked up. After that, conductor bodies of the adhesive agent layer and electrodes of the substrate were aligned. The chip and substrate were temporarily adhered by heating at 150° C. by 5 kg/cm$^2$ for 5 seconds, then, furthermore heated at 160° C. for 60 minutes to firmly adhere the chip and substrate via the above adhesive agent layer so as to obtain a semiconductor device.

Example 6

Production of Semiconductor Device (Adhesive Sheet: Example 2)

A conductor bodies attached adhesive sheet prepared in the example 2 and a semiconductor wafer were aligned so that conductor bodies of the conductor bodies attached adhesive sheet was electrically connected to electrodes of semiconductor integrated circuit formed on the semiconductor wafer. The two were hot-pressed at 180° C. by 5 kg/cm$^2$ for 30 seconds, then, the above conductor bodies attached adhesive sheet was cut along a semiconductor wafer shape.

The PEN film as a base material of the above conductor bodies attached adhesive sheet was removed from the adhesive agent layer, then a separately prepared wafer dicing sheet (ADWILL G-11 produced by Lintec Corporation) was stuck to the adhesive agent layer, and the adhesive agent layer attached semiconductor wafer was fixed on a ring frame.

Full-cut dicing was performed up to the above adhesive agent layer by using a dicing saw (AWD-4000B produced by Tokyo Seimitsu Co., Ltd.), the thus obtained adhesive agent layer attached chip was picked up, then, the conductor bodies of the adhesive agent layer and the electrodes on the substrate were aligned.

After temporarily adhering the chip and the substrate at 180° C. by 5 kg/cm$^2$ for 10 seconds, they were furthermore heated at 200° C. for 60 minutes to firmly adhere the chip and the substrate via the above adhesive agent layer so as to obtain a semiconductor device.

Example 7

Production of Semiconductor Device (Adhesive Sheet: Example 3)

The conductor bodies attached adhesive sheet prepared in the example 3 and a semiconductor wafer were aligned so that the conductor bodies of the conductor bodies attached adhesive sheet were electrically connected to electrodes of a semiconductor integrated circuit formed on the semiconductor wafer. The two were hot-pressed at 140° C. by 5 kg/cm$^2$ for 30 seconds, then the above conductor bodies attached adhesive sheet was cut along a semiconductor wafer shape.

The PET film as a base material of the above conductor bodies attached adhesive sheet was removed from the adhesive agent layer, then a separately prepared wafer dicing sheet (ADWILL G-11 produced by Lintec Corporation) was stuck to the adhesive agent layer, and the adhesive agent layer attached semiconductor wafer was fixed on a ring frame.

Full-cut dicing was performed in a similar way to in the example 6 and thus obtained adhesive agent layer attached chip was picked up. After that, the conductor bodies of the adhesive agent layer and the electrodes on the substrate were aligned, the chip and the substrate were temporarily adhered by heating at 180° C. by 5 kg/cm$^2$ for 5 seconds, then furthermore heated at 180° C. for 60 minutes to firmly adhere the chip and the substrate via the above adhesive agent layer so as to obtain a semiconductor device.

Example 8

Production of Semiconductor Device (Adhesive Sheet: Example 4)

The conductor bodies attached adhesive sheet prepared in the example 4 and a semiconductor wafer were aligned so that the conductor bodies of the conductor bodies attached adhesive sheet were electrically connected to electrodes of a semiconductor integrated circuit formed on the semiconductor wafer. After the two were hot-pressed at 150° C. by 5 kg/cm$^2$ for 30 seconds, the above conductor bodies attached adhesive sheet was cut along the semiconductor wafer shape.

After that, an adhesive agent layer attached chip was obtained in a similar way to in the example 7. The conductor bodies of the adhesive agent layer and the electrodes on the substrates were aligned. The chip and the substrate were temporarily adhered by heating at 150° C. by 5 kg/cm$^2$ for 5 seconds, then furthermore heated at 180° C. for 60 minutes to firmly adhere the chip and the substrate via the above adhesive agent layer so as to obtain a semiconductor device.

Example 9

Production of Semiconductor Device (Adhesive Sheet: Example 1)

The conductor bodies attached adhesive sheet in a wafer shape prepared in the example 1 and a semiconductor wafer were aligned so that the conductor bodies of the conductor bodies attached adhesive sheet were electrically connected to the electrodes of a semiconductor integrated circuit formed on the semiconductor wafer, and a conductor bodies attached adhesive sheet was stuck to the semiconductor wafer.

After irradiating ultraviolet rays to the adhesive agent layer of the above conductor bodies attached adhesive sheet, a polyethylene film as a base material was removed from the adhesive agent layer and the conductor bodies of the adhesive agent layer and the electrodes on the substrate were aligned. After temporarily adhering the semiconductor wafer and the substrate by heating at 150° C. by 5 kg/cm$^2$ for 5 seconds, they were furthermore heated at 160° C. for 60 minutes to firmly adhere the semiconductor wafer and the substrate via the above adhesive agent layer.

A separately prepared ultraviolet ray curing type wafer dicing sheet (ADWILL D-510T produced by Lintec Corporation) was stuck to the above substrate, and the substrate attached semiconductor wafer was fixed to the ring frame. Then full-cut dicing was performed in a similar way to in the example 6. After ultraviolet rays were irradiated to the above ultraviolet ray curing type wafer dicing sheet, thus obtained substrate attached chip was picked up so as to obtain a semiconductor device.

Example 10

Production of Semiconductor Device (Adhesive Sheet: Example 1)

The conductor bodies attached adhesive sheet in a wafer shape prepared in the example 1 and a substrate were aligned so that the conductor bodies of the conductor bodies attached adhesive sheet were electrically connected to electrodes on the substrate, and the conductor bodies attached adhesive sheet was stuck to the substrate.

After irradiating ultraviolet rays to the adhesive agent layer of the above conductor bodies attached adhesive sheet, a polyethylene film as a base material was removed from the adhesive agent layer, and the conductor bodies of the adhesive agent layer and the electrodes of the semiconductor integrated circuit formed on the semiconductor wafer were aligned. After temporarily adhering the substrate and the semiconductor wafer by heating at 150° C. by 5 kg/cm$^2$ for 5 seconds, they were further more heated at 160° C. for 60 minutes to firmly adhere the substrate and the semiconductor wafer via the above adhesive agent layer.

A separately prepared ultraviolet ray curing type wafer dicing sheet (ADWILL D-510T produced by Lintec Co., Ltd.) was stuck to the above substrate, and the substrate attached semiconductor wafer was fixed on the ring frame. Then full-cut dicing is performed in a similar way to in the example 6. After ultraviolet rays were irradiated to the above ultraviolet ray curing type wafer dicing sheet, thus obtained substrate attached chip is picked up so as to obtain a semiconductor device.

Example 11

Production of Semiconductor Device (Adhesive Sheet: Example 1)

The conductor bodies attached adhesive sheet in a wafer shape produced in the example 1 and a substrate were aligned so that the conductor bodies of the conductor bodies attached adhesive sheet were electrically connected to the electrodes on the substrate. The conductor bodies attached adhesive sheet was stuck to the substrate, and the two were fixed on the ring frame.

Full-cut dicing was performed on the adhesive agent layer attached substrate in a similar way to in the example 5. After ultraviolet rays were irradiated to the adhesive agent layer, a polyethylene film as a base material of the conductor bodies attached adhesive sheet was expanded, and an obtained adhesive agent attached substrate was picked up. After that, conductor bodies of the adhesive agent layer and electrodes of a separately diced semiconductor chip were aligned. The substrate and the semiconductor chip were temporarily adhered at 150° C. by 5 kg/cm$^2$ for 5 seconds, then furthermore heated at 160° C. for 60 minutes to firmly adhere the substrate and the semiconductor chip via the above adhesive agent layer.

Example 12

Production of Semiconductor Device (Adhesive Sheet: Example 1)

The conductor bodies attached adhesive sheet of a chip size prepared in the example 1 and a separately diced semiconductor chip were aligned so that the conductor bodies of the conductor bodies attached adhesive sheet were electrically connected to electrodes of the semiconductor chip, and the conductor bodies attached adhesive sheet was stuck to the semiconductor chip.

After irradiating ultraviolet rays to an adhesive agent layer of the above conductor bodies attached adhesive sheet, a polyethylene film as a base material was removed from the adhesive agent layer, and the conductor bodies in the adhesive agent layer and the electrodes on the substrates were aligned. The semiconductor chip and the substrate were temporarily adhered at 150° C. by 5 kg/cm$^2$ for 5 seconds, then, furthermore heated at 160° C. for 60 minutes to firmly adhere the semiconductor chip and the substrate via the above adhesive agent layer.

Example 13

Production of Semiconductor Device (Adhesive Sheet: Example 1)

The conductor bodies attached adhesive sheet of a chip size prepared in the example 1 and a substrate were aligned so that the conductor bodies of the conductor bodies attached adhesive sheet were electrically connected to electrodes on the substrate, and the conductor bodies attached adhesive sheet was stuck to the substrate.

After irradiating ultraviolet rays to the adhesive agent layer of the above conductor bodies attached adhesive sheet, a polyethylene film as a base material was removed from the adhesive agent layer, and the conductor bodies of the adhesive agent layer and electrodes of a separately diced semiconductor chip were aligned. The substrate and the semiconductor chip were temporarily adhered by heating at 150° C. by 5 kg/cm$^2$ for 5 seconds, then, furthermore heated at 160° C. for 60 minutes to firmly adhere the substrate and the semiconductor chip via the above adhesive agent layer.

Test Example

A Pressure Cooker Test was conducted on the semiconductor devices obtained in the examples 5 to 13 under conditions of 121° C., 100% RH, 2 atmospheres and 168 hours. AS a result, no cracks and the like occurred in any of the semiconductor devices.

What is claimed is:

1. A semiconductor device comprising:
    a substrate including substrate electrodes;
    a semiconductor integrated circuit adhered to the substrate and including semiconductor integrated circuit electrodes;
    a hardened adhesive agent layer formed from an adhesive agent with gradable adhesiveness and having conductor bodies buried therein, the adhesive agent including a (meth)acrylate copolymer having a weight-average molecular weight of not less than 30,000, an epoxy resin having a weight-average molecular weight of 100 to 10,000, a photopolymerizable low molecular compound and thermal activation latent epoxy resin curing agent,
    wherein the conductor bodies are connected with the semiconductor integrated circuit electrodes, and the adhesive agent layer is aligned with the substrate so that the conductor bodies buried in the adhesive agent layer and the substrate electrodes are electrically connected.

2. A semiconductor device comprising:

a substrate including substrate electrodes;

a semiconductor wafer adhered to the substrate and including semiconductor integrated circuits, the semiconductor integrated circuits including semiconductor integrated circuit electrodes;

a hardened adhesive agent layer sized to correspond to the semiconductor wafer, formed from an adhesive agent with gradable adhesiveness, and having conductor bodies buried therein and arranged to correspond to the semiconductor integrated circuit electrodes, the adhesive agent including a (meth)acrylate copolymer having a weight-average molecular weight of not less than 30,000, an epoxy resin having a weight-average molecular weight of 100 to 10,000, a photopolymerizable low molecular compound and thermal activation latent epoxy resin curing agent.

wherein the conductor bodies are connected to the semiconductor integrated circuit electrodes, and the adhesive agent layer is aligned with the substrate so that the conductor bodies buried in the adhesive agent layer and the substrate electrodes are electrically connected.

3. A semiconductor device configuration comprising:

a substrate including substrate electrodes;

semiconductor chips adhered to the substrate and each including a semiconductor integrated circuit and semiconductor integrated circuit electrodes;

an adhesive sheet sized and cut to correspond to the semiconductor chips and including an adhesive agent layer formed from an adhesive agent with gradable adhesiveness, and conductor bodies buried therein and arranged to correspond to the semiconductor integrated circuit electrodes, the adhesive agent including a (meth)acrylate copolymer having a weight-average molecular weight of not less than 30,000, an epoxy resin having a weight-average molecular weight of 100 to 10,000, a photopolymerizable low molecular compound and thermal activation latent epoxy resin curing agent.

wherein the conductor bodies are connected to the semiconductor integrated circuit electrodes, and the adhesive agent layer is aligned with the substrate so that the conductor bodies and the substrate electrodes are electrically connected.

4. A semiconductor device comprising:

a semiconductor chip including a semiconductor integrated circuit formed thereon;

an adhesive agent adhered to one surface of the semiconductor chip;

a substrate adhered to the semiconductor chip via the adhesive agent;

wherein the adhesive agent forms a hardened layer with conductor bodies buried therein for electrically connecting electrodes of the semiconductor integrated circuit formed on the semiconductor chip and electrodes of the substrate, the hardened layer formed from the adhesive agent including a (meth)acrylate copolymer having a weight-average molecular weight of not less than 30,000, an epoxy resin having a weight-average molecular weight of 100 to 10,000, a photopolymerizable low molecular compound and thermal activation latent epoxy resin curing agent.

* * * * *